United States Patent [19]
Jeng

[11] Patent Number: 6,080,620
[45] Date of Patent: Jun. 27, 2000

[54] METHOD FOR FABRICATING INTERCONNECTION AND CAPACITORS OF A DRAM USING A SIMPLE GEOMETRY ACTIVE AREA, SELF-ALIGNED ETCHING, AND POLYSILICON PLUGS

[75] Inventor: Erik S. Jeng, Hsinchu, Taiwan

[73] Assignee: Vanguard International Semiconductor Corporation, Hsin-Chu, Taiwan

[21] Appl. No.: 09/089,549

[22] Filed: Jun. 3, 1998

[51] Int. Cl.[7] .................................................. H01L 21/8242
[52] U.S. Cl. ........................ 438/253; 438/239; 438/253; 438/47
[58] Field of Search .................................. 438/239, 253, 438/47

[56] References Cited

U.S. PATENT DOCUMENTS

| | | | |
|---|---|---|---|
| 4,944,682 | 7/1990 | Cronin et al. | 437/192 |
| 4,966,870 | 10/1990 | Barber et al. | 437/228 |
| 5,258,096 | 11/1993 | Sandhu et al. | 156/643 |
| 5,466,636 | 11/1995 | Cronin et al. | 437/187 |
| 5,491,103 | 2/1996 | Ahn et al. | 437/52 |
| 5,679,595 | 10/1997 | Chen et al. | 437/52 |
| 5,723,373 | 3/1998 | Chang et al. | 438/253 |
| 5,930,624 | 7/1999 | Murata et al. | 438/253 |
| 5,933,724 | 8/1999 | Sekiguchi et al. | 438/239 |

*Primary Examiner*—David Nelms
*Assistant Examiner*—Phuc Dang
*Attorney, Agent, or Firm*—George O. Saile; Stephen B. Ackerman; Rosemary L.S. Pike

[57] ABSTRACT

A method for fabricating a DRAM device having a simple geometry active area, self-aligned crown capacitors, and simultaneous formation of bit lines and polysilicon plugs is described. An active area of a semiconductor substrate is separated from other active areas by isolation regions. Gate electrodes and interconnection lines are formed on the substrate and isolation regions and associated source and drain regions are formed within the substrate. A silicon nitride layer is deposited overall to protect the isolation regions from etching and is then removed after openings to the substrate are etched through an insulating layer. Pillars of the insulating layer are left overlying the gate electrodes. A polysilicon layer is deposited to contact the exposed source and drain regions. A second silicon nitride layer is deposited overlying the polysilicon layer. The second silicon nitride layer and the polysilicon layer are etched away where they are not covered by a mask with an etch stop at the pillars to form a bit line whereby the polysilicon layer remaining between the pillars forms polysilicon landing plugs and wherein the polysilicon landing plug underlying the bit line forms a bit line contact. A second insulating layer is etched away where it is not covered by a mask to form contact openings to the polysilicon landing plugs on either side of the bit line. A crown-shaped capacitor is formed within the contact openings.

41 Claims, 10 Drawing Sheets

METHOD FOR FABRICATING INTERCONNECTION AND CAPACITORS OF A DRAM USING A SIMPLE GEOMETRY ACTIVE AREA, SELF-ALIGNED ETCHING, AND POLYSILICON PLUGS

BACKGROUND OF THE INVENTION (1) Field of the Invention

The present invention relates to a method of fabricating a dynamic random access memory device, and more particularly, to a method of forming a dynamic random access memory device having a simple geometry active area, self-aligned crown capacitors, and simultaneous formation of bit lines and polysilicon plugs.

(2) Description of the Prior Art

Dynamic random access memory (DRAM) devices are widely used in the art. Large DRAM devices are normally silicon based, and each cell typically embodies a single MOS field effect transistor with its source connected to a storage capacitor. Conventional DRAM capacitor fabrications consist of a contact hole patterning for capacitor nodes and a polysilicon patterning for lower plates of the capacitors. As the line width of DRAM's shrinks, the aspect ratio of the contact holes increases and the effective area of the capacitors decreases. Also, the traditional s-shape of the active area of a DRAM causes difficulties in the patterning of twisted bit lines. Improvements of the complicated active area, contact technology, and novel capacitors are in great demand for DRAM manufacturing.

U.S. Pat. No. 4,966,870 to Barber et al and U.S. Pat. No. 5,944,682 to Cronin et al teach methods of forming borderless contacts using a two-step etching process in which there is high selectivity to oxide with respect to silicon nitride. U.S. Pat. No. 5,258,096 to Sandhu et al teaches a method using a conductive layer as an etch stop for a self-aligned contact. U.S. Pat. No. 5,466,636 to Cronin et al shows another method of making a borderless contact. U.S. Pat. No. 5,491,104 to Lee et al teaches using polysilicon as a protective etch stop layer in forming a fin-shaped capacitor. U.S. Pat. No. 5,491,103 to Ahn et al teaches a method of forming a crown capacitor and bit line contacts.

SUMMARY OF THE INVENTION

Accordingly, it is a primary object of the invention to provide an effective and very manufacturable process for producing a DRAM integrated circuit device.

Another object of the present invention is to provide a method for fabricating a DRAM device having a simple geometry active area.

Yet another object is to provide a method for fabricating a DRAM device having self-aligned crown capacitors.

Yet another object is to provide a method for fabricating a DRAM device having simultaneous formation of bit lines and polysilicon plugs.

A still further object of the invention is to provide a method for fabricating a DRAM device having a simple geometry active area, self-aligned crown capacitors, and simultaneous formation of bit lines and polysilicon plugs.

In accordance with the objects of this invention, a method for fabricating a DRAM device having a simple geometry active area, self-aligned crown capacitors, and simultaneous formation of bit lines and polysilicon plugs is achieved. An active area of a semiconductor substrate is separated from other active areas by isolation regions. Gate electrodes and interconnection lines are formed on the semiconductor substrate and isolation regions and associated source and drain regions are formed within the semiconductor substrate. A first layer of silicon nitride is deposited overlying the gate electrodes and interconnection lines and the semiconductor substrate and isolation regions. The first silicon nitride layer is partially etched back to leave first spacers on the sidewalls of the gate electrodes and interconnection lines. A first insulating layer is deposited overlying the substrate. A photoresist mask is formed over the first insulating layer. The first insulating layer is etched away where it is not covered by the photoresist mask wherein this etching has a high selectivity to the first insulating layer with respect to the first silicon nitride layer whereby the isolation regions are protected by the first silicon nitride layer during the etching and whereby pillars of the first insulating layer are formed overlying each of the gate electrodes and interconnection lines. Thereafter, the first silicon nitride layer not covered by the photoresist mask is etched away whereby the source and drain regions within the semiconductor substrate are exposed. A layer of polysilicon is deposited over the substrate and contacting the exposed source and drain regions. A second silicon nitride layer is deposited overlying the polysilicon layer. The second silicon nitride layer and the polysilicon layer are etched away where they are not covered by a mask with an etch stop at the pillars to form a bit line whereby the polysilicon layer remaining between the pillars and contacting the source and drain regions forms polysilicon landing plugs and wherein the polysilicon landing plug underlying the bit line forms a bit line contact and wherein corners of the pillars are exposed. The exposed corners of the pillars are etched away. Second spacers are formed on the sidewall of the bit line contact wherein the second spacers overlie the pillars where the exposed corners have been etched away. A second insulating layer is deposited overlying the substrate. The second insulating layer is etched away where it is not covered by a mask to form a contact opening to another of the polysilicon landing plugs. A first conducting layer is deposited conformally over the surface of the second insulating layer and within the contact opening wherein the first conducting layer forms a lower electrode of the capacitor. A third insulating layer is deposited overlying the first conducting layer. The third insulating layer is polished away until the first conducting layer on the top surface of the second insulating layer is removed and the second insulating layer is exposed. The third insulating layer and exposed second insulating layer are removed. A capacitor dielectric layer is deposited overlying the first conducting layer. A second conducting layer is deposited overlying the capacitor dielectric layer wherein the second conducting layer forms the upper electrode of the capacitor to complete formation of a DRAM with capacitor.

Also, in accordance with the objects of this invention, a DRAM device having a simple geometry active area, self-aligned crown capacitors, and simultaneous formation of bit lines and polysilicon plugs is achieved. The DRAM device having a capacitor comprises an active area of a semiconductor substrate separated from other active areas by isolation regions. Gate electrodes and interconnection lines lie on the semiconductor substrate and isolation regions and associated source and drain regions lie within the semiconductor substrate. Silicon nitride spacers have been formed on the sidewalls of the gate electrodes and interconnection lines. Polysilicon landing plugs contact the source and drain regions. A bit line overlies one of the polysilicon landing plugs. A capacitor having a crown shape overlies the bit line and the polysilicon landing plugs. A first conducting layer contacting the polysilicon landing plugs on either side of the bit line forms a lower electrode of the capacitor wherein the polysilicon landing plugs form a capacitor node. A capacitor dielectric layer overlies the first conducting layer. A second conducting layer overlying the capacitor dielectric layer forms the upper electrode of the capacitor to complete the DRAM with capacitor.

BRIEF DESCRIPTION OF THE DRAWINGS

In the following drawings forming a material part of this description, there is shown:

FIGS. 2 through 18 are schematic cross-sectional representations of a preferred embodiment of the present invention.

DESCRIPTION OF THE PREFERRED EMBODIMENTS

Referring now to FIGS. 2 through 18, the process of the present invention for forming the DRAM integrated circuit device illustrated in top view in FIG. 1 having a simple geometry active area, self-aligned crown capacitors, and simultaneous formation of bit lines and polysilicon plugs will be described.

Figure 2:
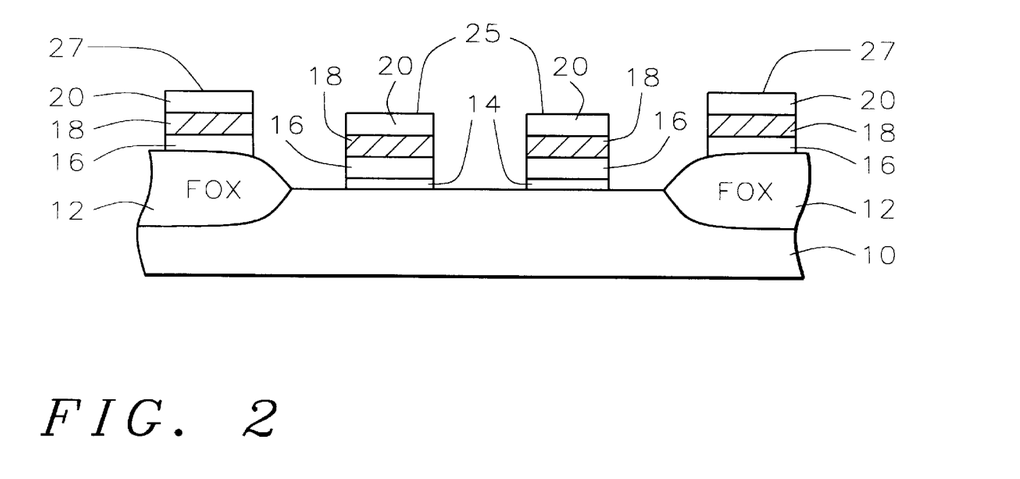

Referring now more particularly to FIG. 2, the first series of steps involves the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. Field oxide regions 12 are formed in and on the semiconductor substrate. Alternatively, shallow trench isolation (STI) regions may be formed instead of field oxide regions.

The surface of the silicon substrate 10 is thermally oxidized to form the desired gate oxide 14 thickness. The polysilicon layer 16 is blanket deposited by low pressure chemical vapor deposition (LPCVD) to a preferred thickness of between about 500 to 1500 Angstroms. A silicide layer 18, such as titanium silicide, tungsten silicide, copper silicide, or the like, is deposited over the polysilicon layer 16. A capping layer 20 of silicon nitride is chemically vapor deposited over the surface of the silicide layer to a thickness of between about 1500 to 2500 Angstroms. The layers 14, 16, 18, and 20 are patterned by lithography and anisotropic etching techniques as are conventional in the art to provide a desired pattern of gate electrodes 25 and word lines 27 as seen in FIG. 2.

The source/drain structure of the MOS FET may now be formed by the following steps. FIGS. 2 through 18 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a capacitor while the peripheral circuits are often composed of CMOS devices.

Figure 3:
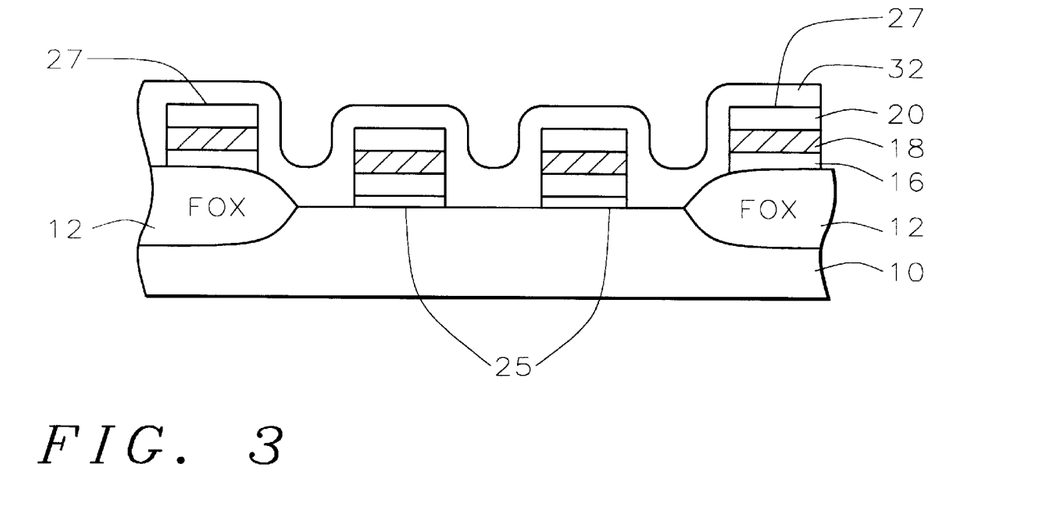

Lightly doped source and drain regions, not shown, are formed by ion implantation. The dielectric spacer is now to be formed followed by the completion of the lightly doped drain source/drain structures. In the process of the present invention, a silicon nitride spacer is formed. This silicon nitride layer is important for its role in protecting the field oxide or STI regions during etching. A layer of silicon nitride 32 is deposited over the surface of the substrate to a thickness of between about 400 to 1000 Angstroms, as shown in FIG. 3.

Figure 4:
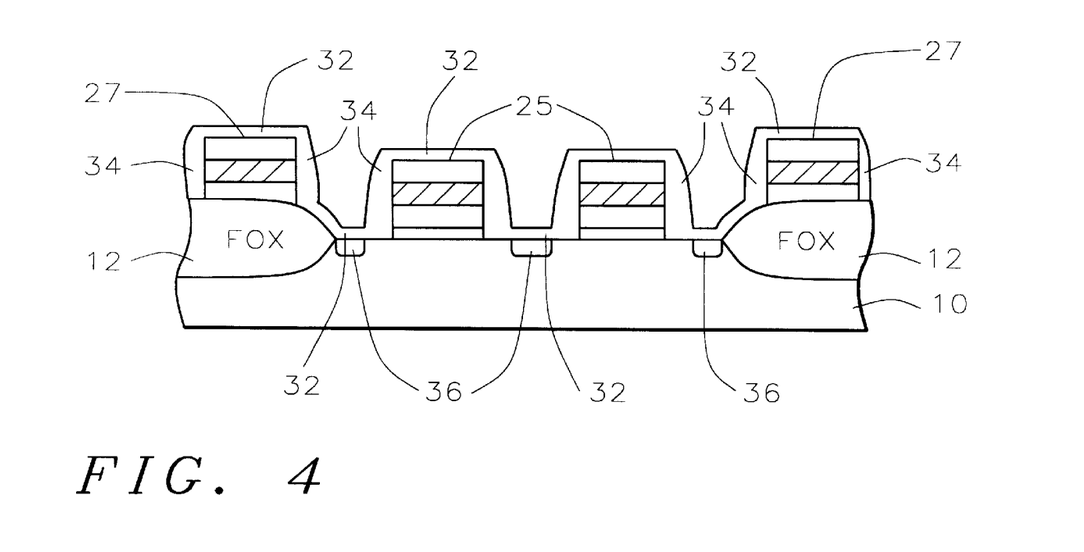

Referring now to FIG. 4, the layer 32 is partially etched back by about 300 to 900 Angstroms. This anisotropic etching of this layer produces the silicon nitride spacers 34 on the sidewalls of the gate electrodes 25 and word lines 27, and leaves a thin layer 32 of silicon nitride on the horizontal surfaces. This thin layer 32 of silicon nitride has a thickness of between about 50 to 150 Angstroms, depending upon etch rate uniformity and silicon nitride film uniformity. The heavily doped source and drain regions 36 are formed by ion implantation, as is conventional in the art.

Figure 5:
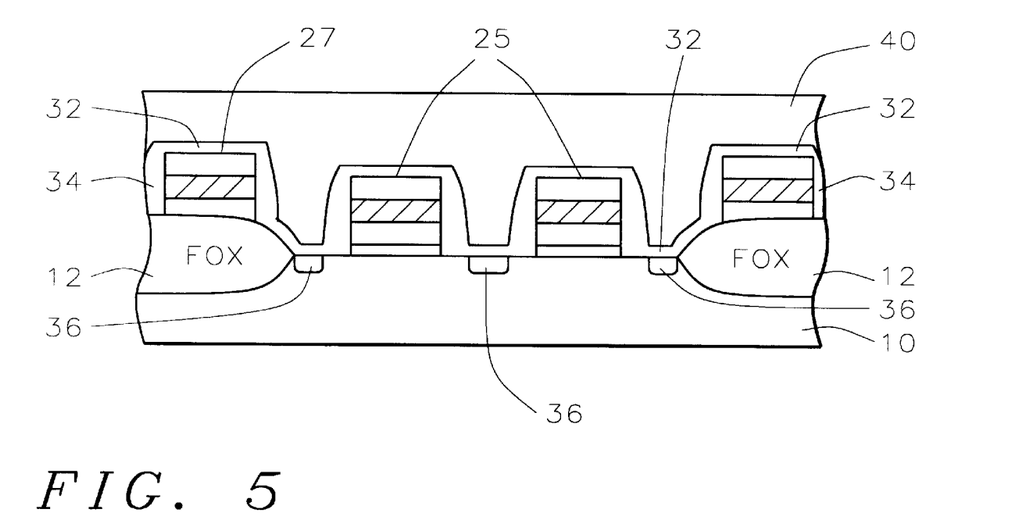

Referring now to FIG. 5, a thick insulating layer, such as tetraethoxysilane (TEOS) oxide or borophosphosilicate glass (BPSG) 40 is deposited to a thickness of between about 4000 to 10,000 Angstroms and then planarized, for example by chemical mechanical polishing (CMP) or etchbacks to obtain a flat surface.

Figure 6:
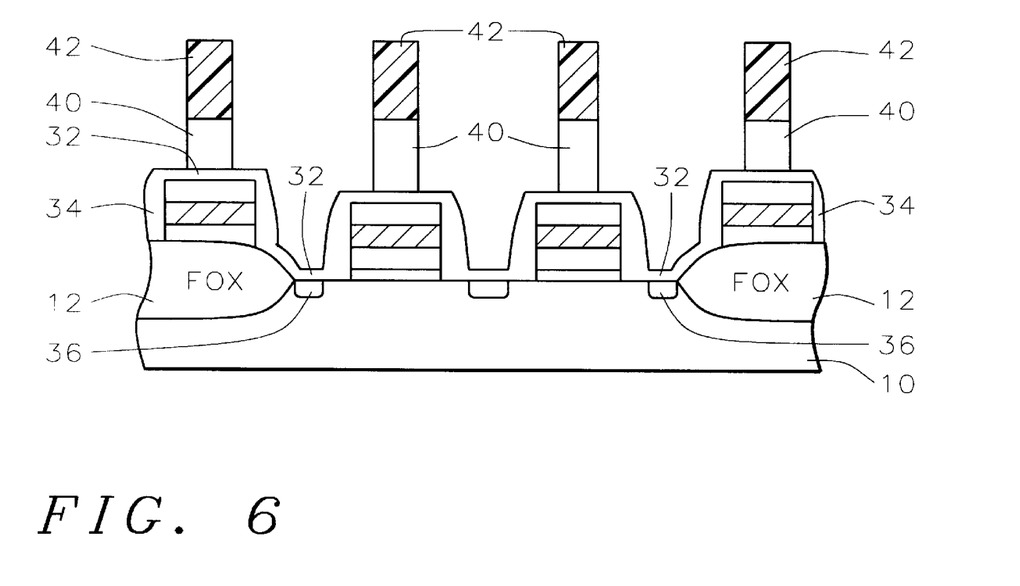
Figure 7:
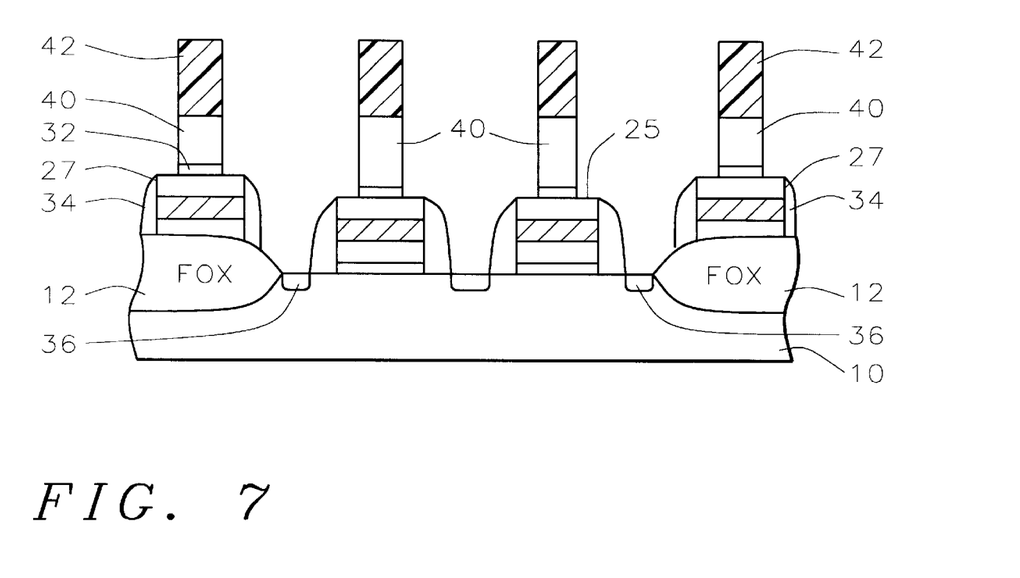

Referring now to FIG. 6, a layer of photoresist is coated over the insulating layer 40 and patterned as is conventional in the art to form the landing plug photoresist mask 42. The insulating layer 40 is etched using an etching recipe which has a high selectivity of oxide to silicon nitride. The etching gases include $C_4F_8$, $CH_2F_2$, CO, $O_2$, and Ar. Etching conditions include RF power of 1000 to 1800 watts in a reactive ion etch (RIE) etcher and a pressure of between about 30 and 50 mTorr. The etching selectivity of silicon oxide to silicon nitride is about 20:1. Oxide pillars 40 are left overlying each of the gate electrodes and interconnection lines.

After this etching, the thin layer of silicon nitride 32 remains on the surface of the substrate, as shown in FIG. 6. This silicon nitride layer protects the FOX oxide or STI oxide from etching. Next, referring to FIG. 7, the remaining silicon nitride layer 32 on the surface of the substrate and the horizontal layer 32 on the gate electrodes 25 and word lines 27 not covered by the mask is removed using an etching recipe that is highly selective to silicon nitride with respect to oxide. This etching recipe uses the same gases as in the first etching recipe, but at a power of 200 to 800 watts and under pressure of 30 to 200 mTorr and with an etching selectivity of silicon nitride to silicon oxide of about 40:1. The silicon nitride layer 32 is completely removed and the underlying oxide is not damaged.

Figure 8:
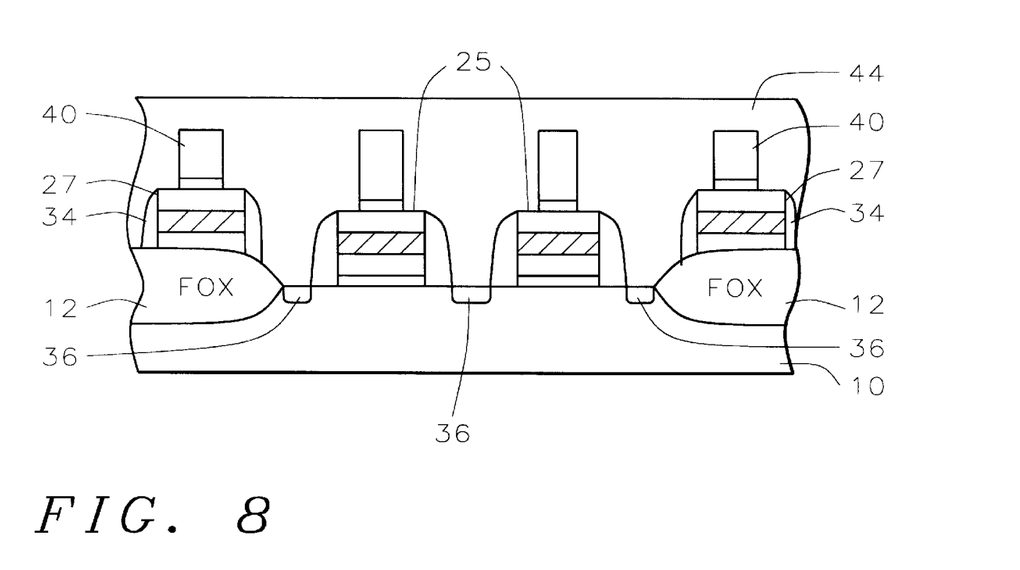
Figure 9:
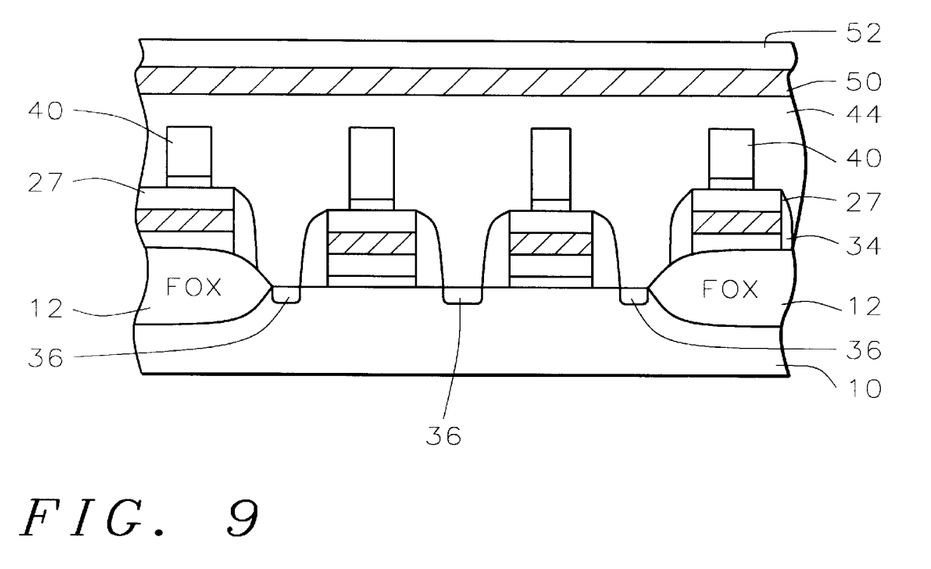

Referring now to FIG. 8, the photoresist mask is removed. A polysilicon layer 44 is deposited over the surface of the substrate to a thickness of between about 3000 to 6000 Angstroms. The polysilicon layer 44 is etched back to leave between about 900 and 1100 Angstroms of polysilicon overlying the insulating layer 40, as shown in FIG. 8. A silicide layer 50, such as tungsten silicide, is deposited over the polysilicon layer 44. A capping layer 52 of silicon nitride or silicon oxynitride is deposited over the planarized silicide layer to a thickness of between about 1500 and 2500 Angstroms.

Figure 10:
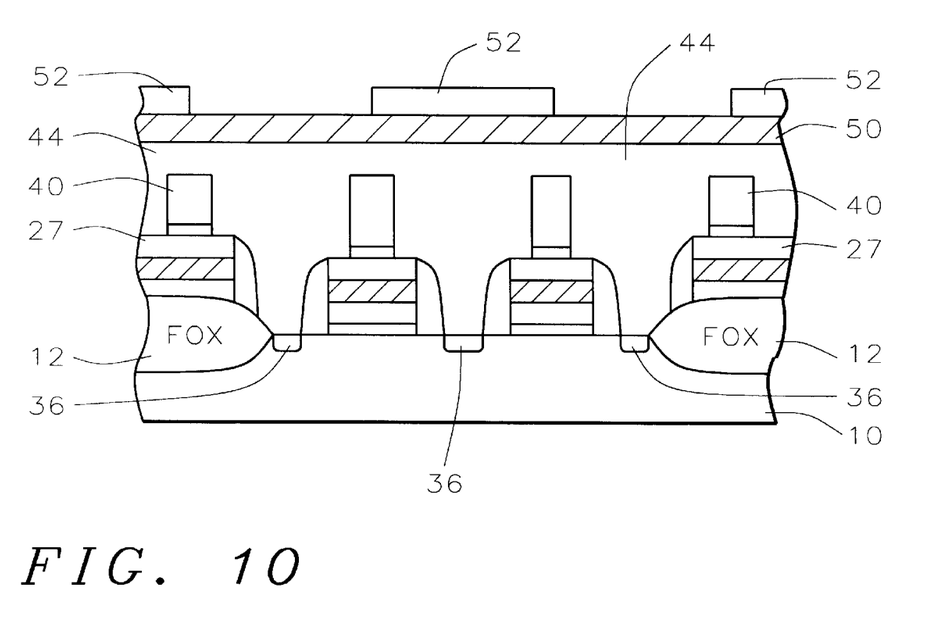
Figure 11A:
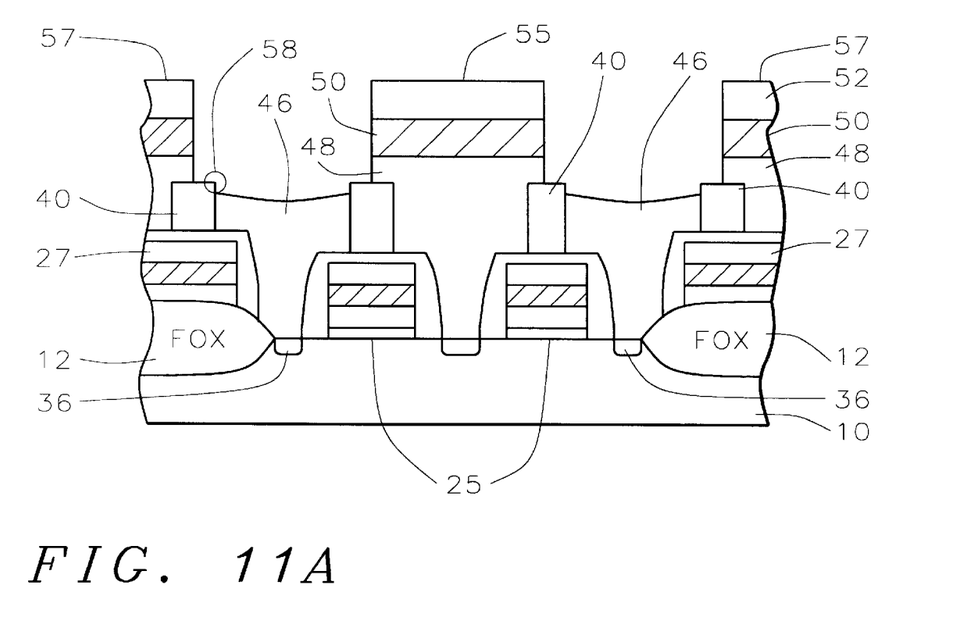
FIGS. 11A and 11B are schematic cross-sectional representations of different views across top view FIG. 1 of the present invention.
Figure 11B:
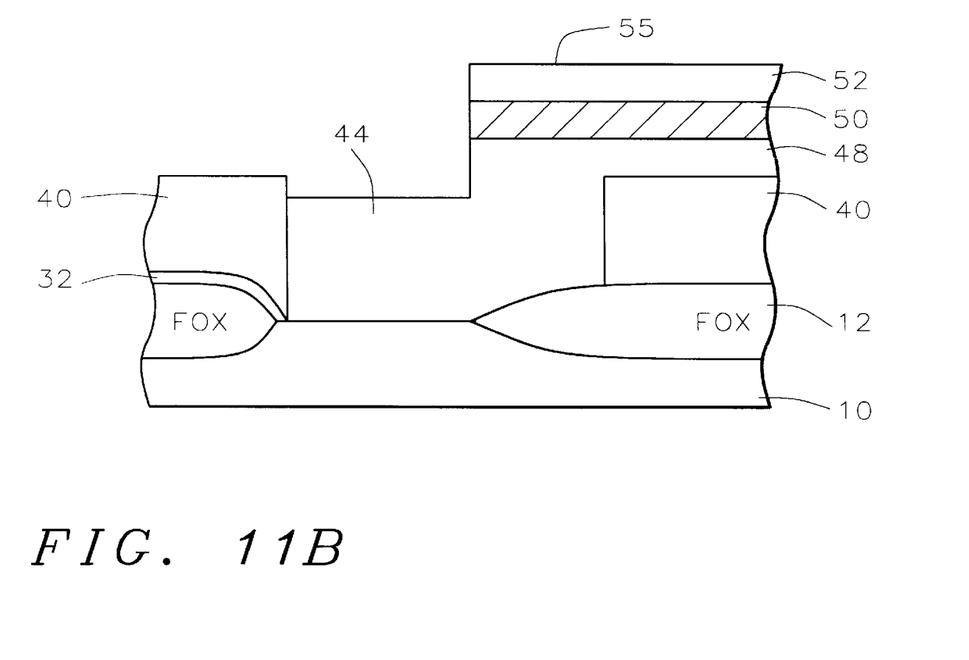

The silicon nitride layer 52 is etched away where it is not covered by a mask, as illustrated in FIG. 10. Referring now to FIG. 11A, the polysilicon 44 and silicide 50 are etched away where they are not covered by the mask. Bit lines 55 and 57 are formed by this etch. Capacitor node contact plugs 46 are formed naturally without a special contact etch. Referring to FIG. 1 in top view, bit lines 55 and 57 can be seen. The rectangular contact plug 44 is shown overlapping the bit line 55. The overlap area 48 is the naturally formed bit line contact. FIG. 11B shows another view of FIG. 1 through the contact plug 44. Bit line 55 and bit line contact 48 can be seen in this view.

A shallow oxide etch is performed to etch away the exposed corners 58 of the oxide pillars 40. This assures discontinuity between the polysilicon plug contacts 46 and 48.

Figure 12:
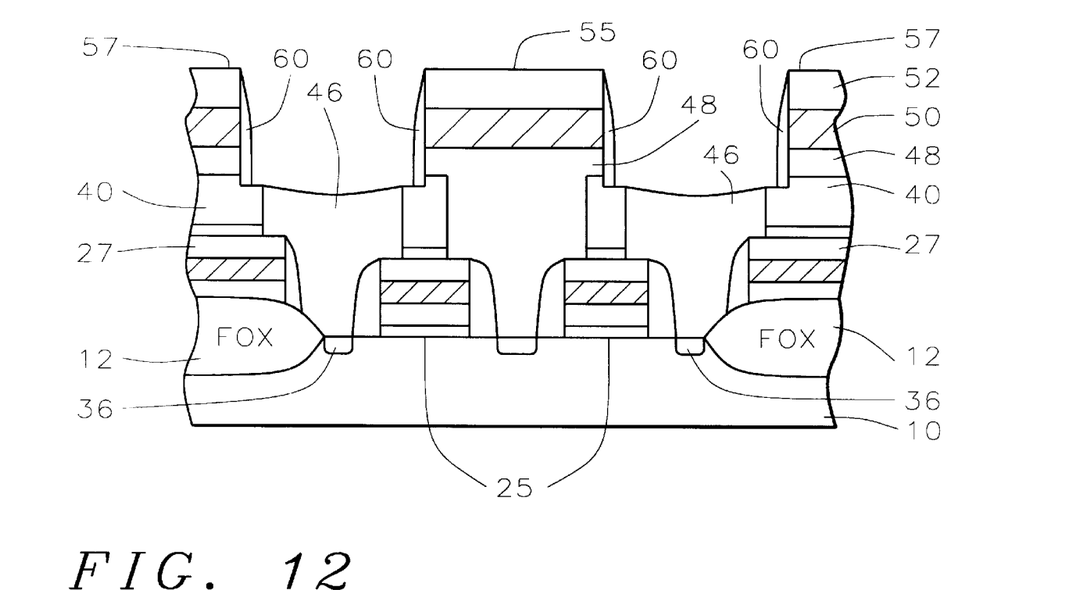

Referring now to FIG. 12, another layer of silicon nitride or silicon oxynitride is deposited and anisotropically etched to form silicon nitride spacers 60 on the sidewalls of the bit lines 55 and 57. These spacers 60 overlie the oxide pillars where the corners have been etched away.

Figure 13:
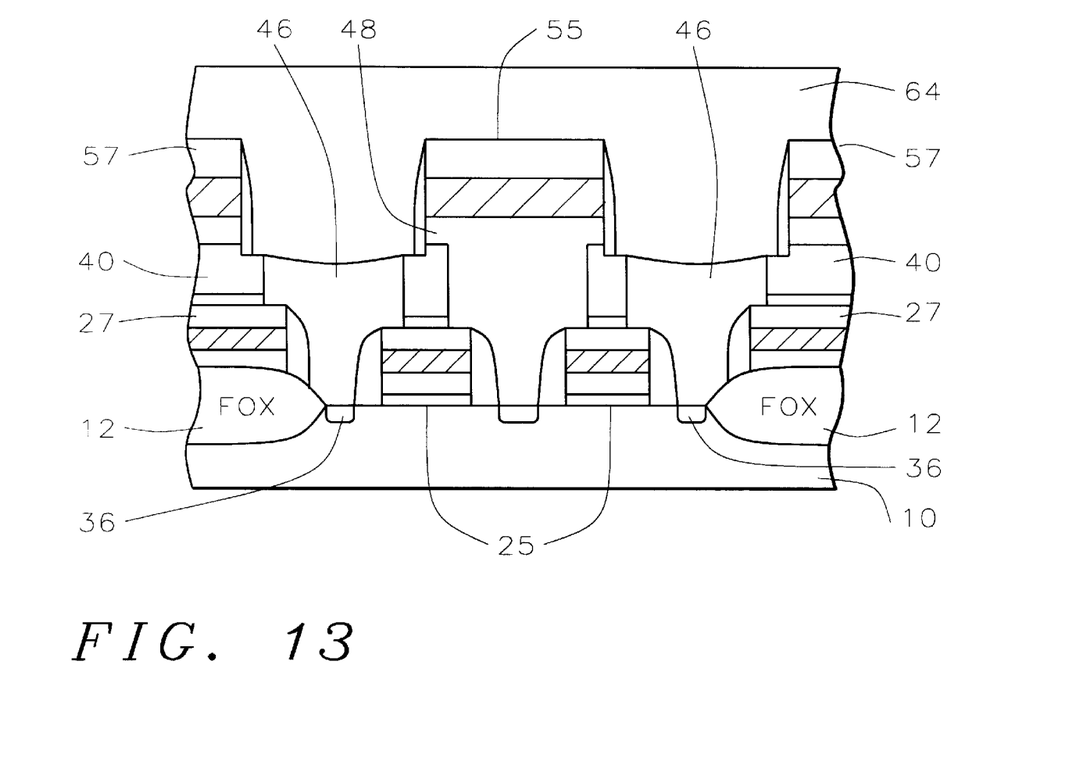

Next, as illustrated in FIG. 13, a layer 64 of BPSG or spin-on-glass is deposited over the surface of the substrate to a thickness of between about 7000 and 15,000 Angstroms and flowed or etched back to planarize its surface.

Figure 14:
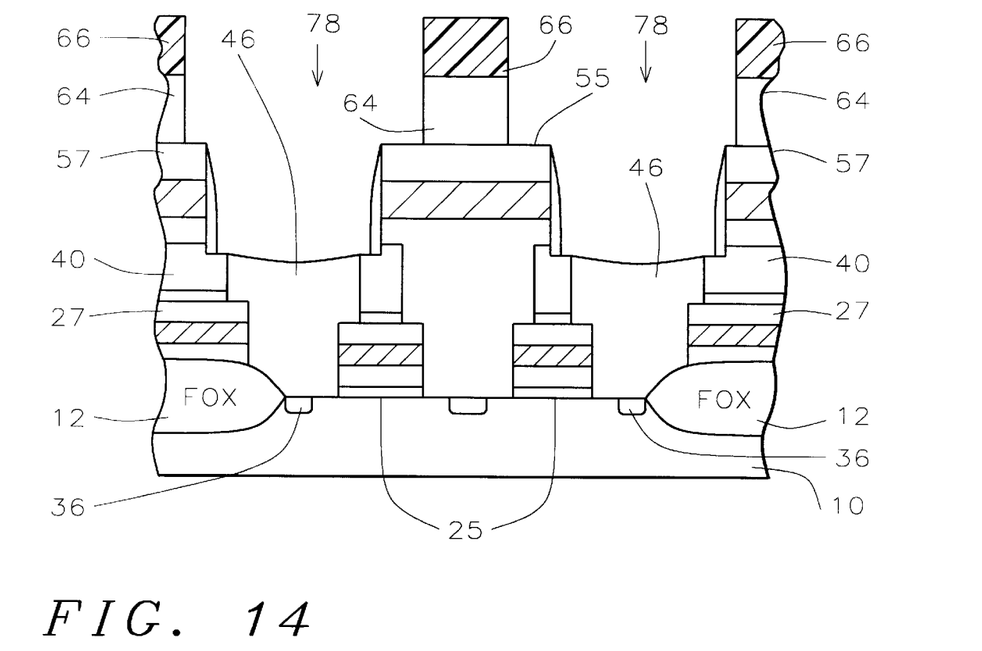

Referring now to FIG. 14, the BPSG layer is covered by a grid-lock capacitor mask 66. The BPSG layer 64 is etched away where it is not covered by the mask 66 to form self-aligned contact openings 78 to the landing plugs 46.

Figure 15:
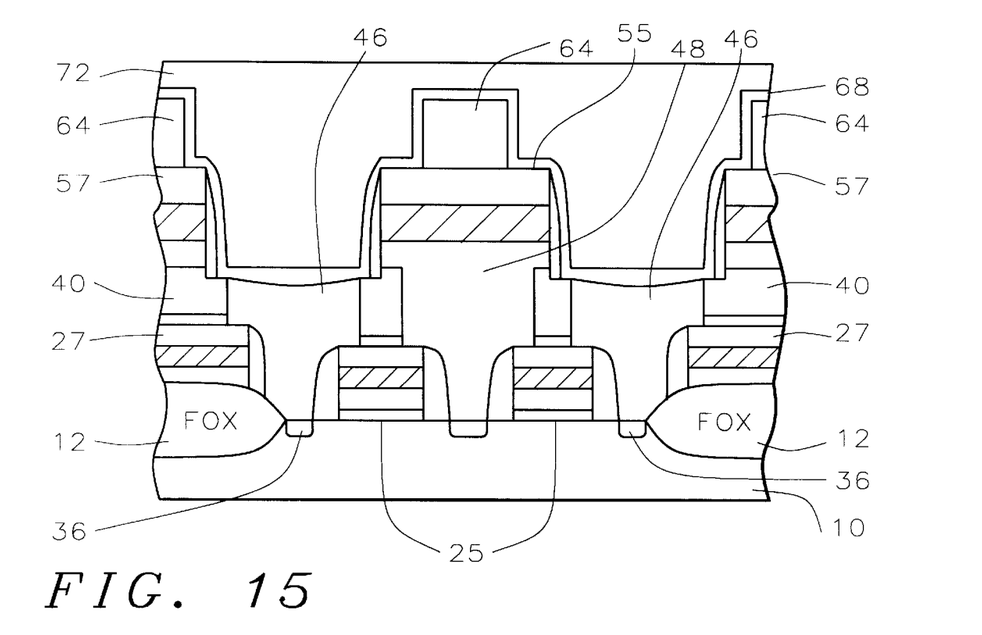

A conducting layer 68 is conformally deposited over the surface of the substrate to form the lower electrode of the crown capacitor. This conducting layer may be polysilicon, tungsten, titanium nitride, or the like, and is deposited to a thickness of between about 300 and 1000 Angstroms, as illustrated in FIG. 15. A layer of oxide, photoresist, or organic polymer 72 is blanket deposited over the conducting layer to a thickness of between about 3000 and 10,000 Angstroms.

Figure 16:
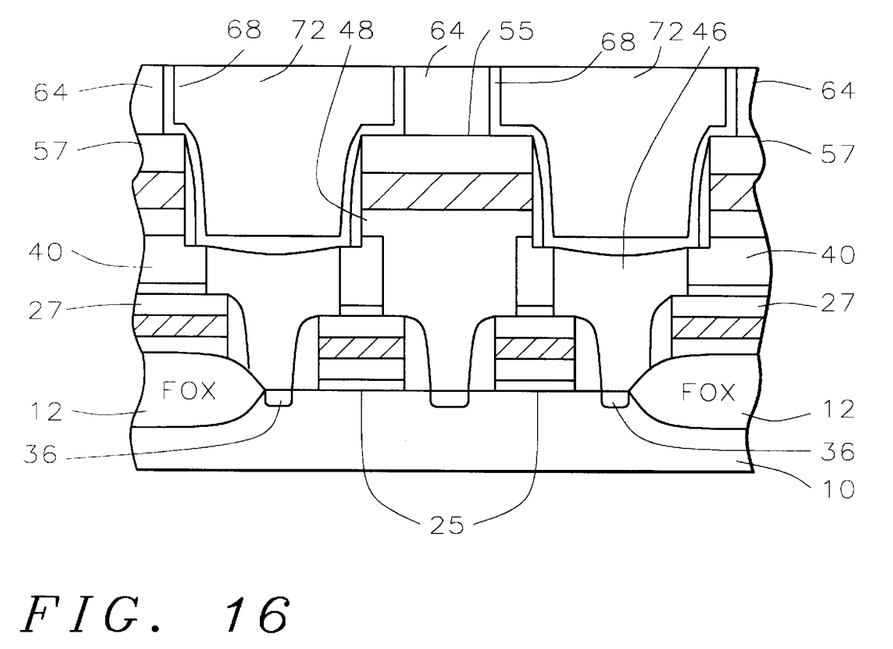

Referring now to FIG. 16, the oxide layer 72 is polished using CMP wherein the conducting layer 68 on the top surfaces of the BPSG layer 64 is also polished away exposing a portion of the second insulating layer 64.

Figure 17:
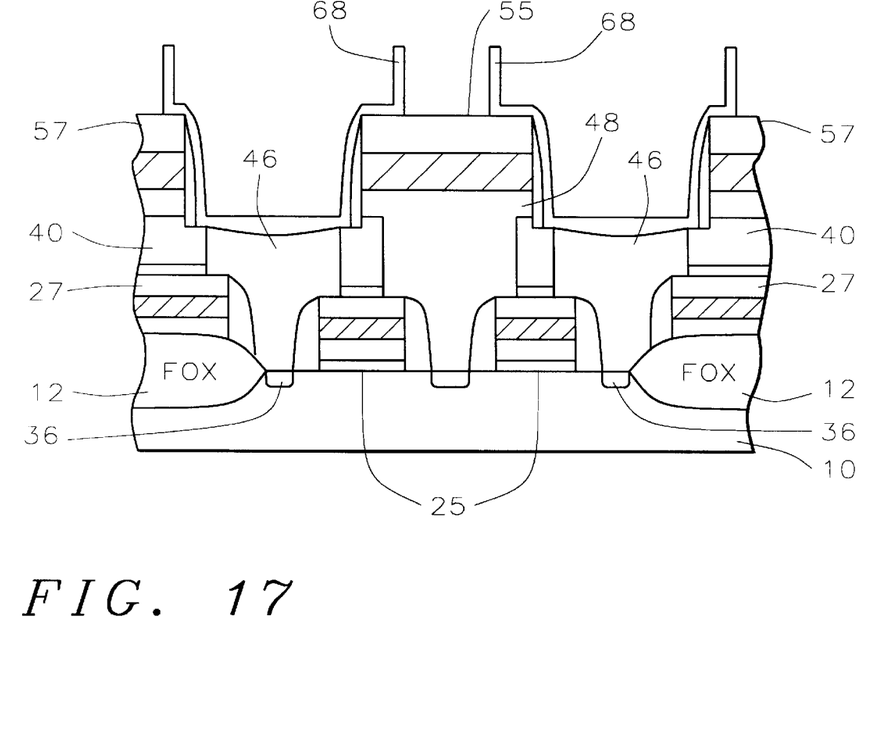

Now, the exposed BPSG layer 64 and oxide layer 72 are removed, as illustrated in FIG. 17. Next, referring to FIG. 18, an insulating layer 76 having a high dielectric constant is conformally deposited over the bottom electrode 68. The insulating layer may comprise tantalum oxide ($Ta_2O_5$), barium strontium titanate (BST), phosphorus zirconium titanate (PZT), or a thin silicon oxide-silicon nitride-silicon oxide (ONO) film having a thickness of between about 30 and 200 Angstroms.

Figure 18:
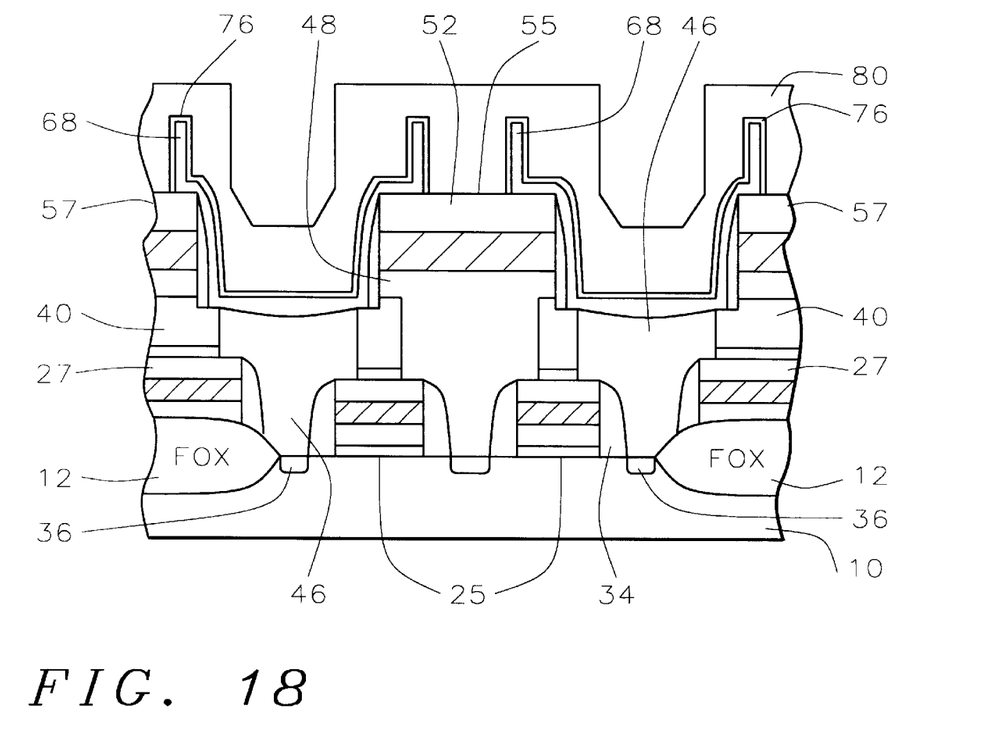

The top plate electrode is formed by depositing a second conducting layer 80, such as polysilicon, titanium nitride, or tungsten, or a combination of these materials. The thickness of this layer 80 is between about 500 and 1500 Angstroms. This completes the crown-shaped capacitor having lower electrode 68, capacitor dielectric 76, and upper electrode 80. The polysilcon landing plugs 46 form the capacitor node.

This completes the fabrication of interconnectors and capacitors for a DRAM memory cell. FIG. 1 is a top view of the completed DRAM cell. View 18—18 is shown in cross-section in FIG. 18. The active area 90 has a simple geometry having good patterning performance and wide processing windows. Bit lines 55 and 57 are illustrated in FIG. 1. Bit line contact 48 to bit line 55 is shown. Word lines 25 are illustrated perpendicular to the bit lines. The openings 78 for the capacitors 68/76/80 are shown as dotted lines in FIG. 1.

The process of the invention results in a DRAM having a simple active area and self-aligned crown capacitors and incorporating simultaneous formation of bit lines and polysilicon plugs.

Figure 1:
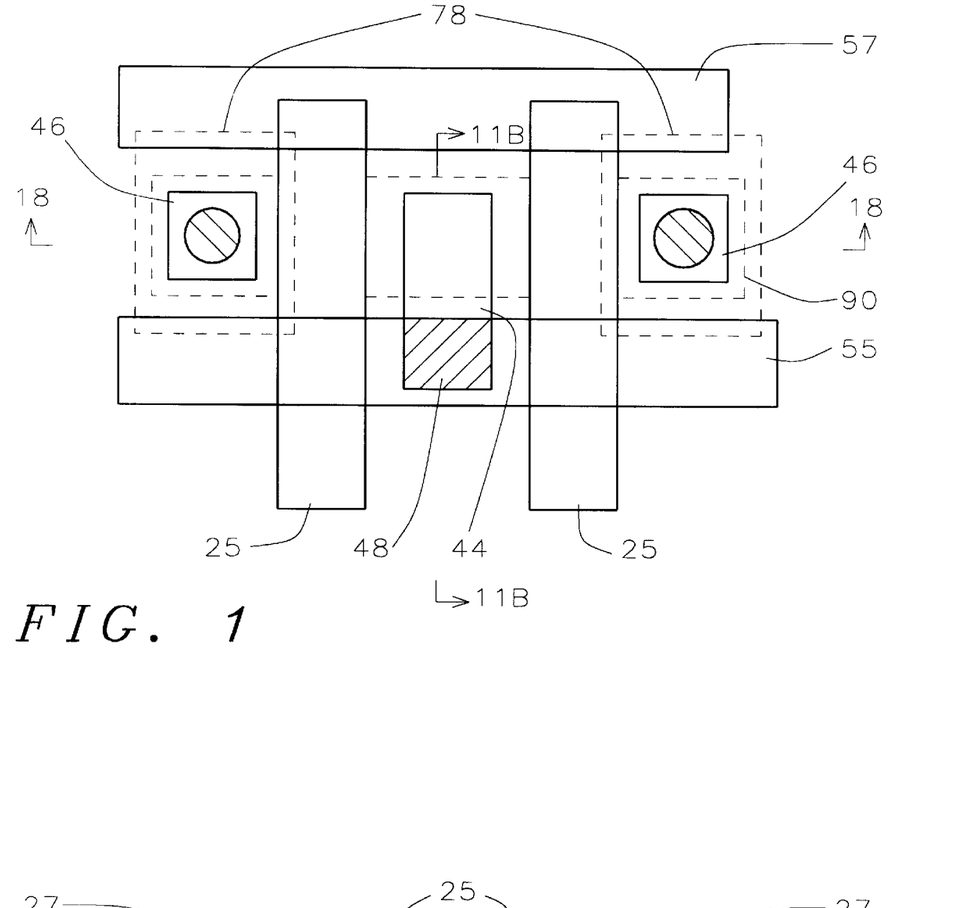
FIG. 1 is a top-view of a DRAM of the present invention.

Referring now to FIG. 1 and FIG. 18, the DRAM integrated circuit device of the present invention having a simple geometry active area, self-aligned crown capacitors, and simultaneous formation of bit lines and polysilicin plugs will be described. The DRAM device having a capacitor comprises an active area of a semiconductor substrate 10 separated from other active areas by isolation regions 12. Gate electrodes 25 and interconnection lines 27 lie on the semiconductor substrate 10 and isolation regions 12 and associated source and drain regions 36 lie within the semiconductor substrate. Silicon nitride spacers 34 have been formed on the sidewalls of the gate electrodes 25 and interconnection lines 27. Polysilicon landing plugs 46 contact the source and drain regions 36. A bit line 55 overlies one of the polysilicon landing plugs 48. A capacitor having a crown shape overlies the bit line 55 and the polysilicon landing plugs 46. The capacitor is electrically isolated from the bit line 55 by the capping silicon nitride layer 52. A first conducting layer 68 contacting the polysilicon landing plugs 46 on either side of the bit line 55 forms a lower electrode of the capacitor wherein the polysilicon landing plugs 46 form a capacitor node. A capacitor dielectric layer 76 overlies the first conducting layer. A second conducting layer 80 overlying the capacitor dielectric layer forms the upper electrode of the capacitor to complete the DRAM with crown-shaped capacitor.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a dynamic random access memory (DRAM) having a capacitor comprising:

providing an active area of a semiconductor substrate separated from other active areas by isolation regions;

forming gate electrodes and interconnection lines on said semiconductor substrate and said isolation regions and forming associated source and drain regions within said semiconductor substrate;

depositing a first layer of silicon nitride overlying said gate electrodes and interconnection lines and said semiconductor substrate and said isolation regions;

partially etching back said first silicon nitride layer to leave first spacers on the sidewalls of said gate electrodes and interconnection lines and leaving said first silicon nitride layer overlying said gate electrodes, said interconnection lines, said semiconductor substrate, and said isolation regions;

depositing a first insulating layer overlying said substrate;

forming a photoresist mask over said first insulating layer;

first etching away said first insulating layer where it is not covered by said photoresist mask wherein said first etching has a high selectivity of said first insulating layer with respect to said first silicon nitride layer whereby said isolation regions are protected by said first silicon nitride layer during said first etching and whereby pillars of said first insulating layer are formed overlying each of said gate electrodes and said interconnection lines;

thereafter second etching away said first silicon nitride layer not covered by said photoresist mask whereby said source and drain regions within said semiconductor substrate are exposed;

depositing a layer of polysilicon over said substrate and contacting said exposed source and drain regions;

depositing a second silicon nitride layer overlying said polysilicon layer;

etching away said second silicon nitride layer and said polysilicon layer where they are not covered by a mask with an etch stop at said pillars to form a bit line whereby said polysilicon layer remaining between said pillars and contacting said source and drain regions forms polysilicon landing plugs and wherein said polysilicon landing plug underlying said bit line forms a bit line contact and wherein corners of said pillars are exposed;

etching away said exposed corners of said pillars;

forming second spacers comprising silicon nitride on the sidewall of said bit line wherein said second spacers overlie said pillars where said exposed corners have been etched away;

depositing a second insulting layer overlying said substrate;

etching away said second insulating layer where it is not covered by a mask to form a contact opening to another of said polysilicon landing plugs;

depositing a first conducting layer conformally over the surface of said second insulating layer and within said contact opening wherein said first conducting layer forms a lower electrode of said capacitor;

depositing a third insulating layer overlying said first conducting layer and polishing away said third insulating layer until said first conducting layer on the top surface of said second insulating layer is removed thereby exposing said second insulating layer;

removing said third insulating layer and said exposed second insulating layer;

depositing a capacitor dielectric layer overlying said first conducting layer; and depositing a second conducting layer overlying said capacitor dielectric layer wherein said second conducting layer forms the upper electrode of said capacitor to complete formation of said DRAM with capacitor.

2. The method according to claim 1 wherein said isolation regions comprise field oxide.

3. The method according to claim 1 wherein said isolation regions comprise shallow trench isolation.

4. The method according to claim 1 wherein said first silicon nitride layer has a deposited thickness of between about 400 and 1000 Angstroms.

5. The method according to claim 1 wherein after said step of partially etching back said first silicon nitride layer, said first silicon nitride layer has a thickness of between about 50 and 150 Angstroms.

6. The method according to claim 1 wherein said first insulating layer comprises tetraethoxysilane (TEOS) oxide.

7. The method according to claim 1 wherein said first insulating layer comprises borophosphosilicate glass (BPSG).

8. The method according to claim 1 wherein said first insulating layer is planarized by chemical mechanical polishing.

9. The method according to claim 1 wherein said first insulating layer is planarized by etching back.

10. The method according to claim 1 wherein said first etching comprises flowing $C_4F_8$, $CH_2F_2$, CO, $O_2$, and Ar gases at a radio frequency power of 1000 to 1800 watts under a pressure of 30 to 50 mTorr and having a selectivity of oxide to silicon nitride of about 20:1.

11. The method according to claim 1 wherein said second etching comprises flowing $C_4F_8$, $CH_2F_2$s CO, $O_2$, and Ar gases at a radio frequency power of 200 to 800 watts under a pressure of 30 to 200 mTorr and having a selectivity of silicon nitride to oxide of about 40:1.

12. The method according to claim 1 further comprising depositing a silicide layer overlying said polysilicon layer.

13. The method according to claim 1 wherein said second spacers comprise silicon oxynitride.

14. The method according to claim 1 wherein said second insulating layer comprises BPSG having a thickness of between about 7000 and 10,000 Angstroms and wherein said BPSG is reflowed to planarize its surface.

15. The method according to claim 1 wherein said second insulating layer comprises spin-on-glass having a thickness of between about 7000 and 10,000 Angstroms and wherein said spin-on-glass is partially etched back to planarize its surface.

16. The method according to claim 1 wherein said first conducting layer comprises one of the group containing polysilicon, tungsten, and titanium nitride.

17. The method according to claim 1 wherein said third insulating layer comprises silicon oxide having a thickness of between about 5000 and 10,000 Angstroms.

18. The method according to claim 1 wherein said capacitor dielectric layer comprises one of the group containing tantalum oxide, barium strontium titanate, phosphorus zirconium titanate, and silicon oxide-silicon nitride-silicon oxide (ONO) and wherein said capacitor dielectric layer has a thickness of between about 30 and 200 Angstroms.

19. The method according to claim 1 wherein said second conducting layer comprises one of the group containing polysilicon, titanium nitride, and tungsten and has a thickness of between about 500 and 1500 Angstroms.

20. A method for fabricating a dynamic random access memory (DRAM) having a capacitor comprising:

providing an active area of a semiconductor substrate separated from other active areas by isolation regions;

forming gate electrodes and interconnection lines on said semiconductor substrate and said isolation regions and forming associated source and drain regions within said semiconductor substrate;

depositing a first layer of silicon nitride overlying said gate electrodes and interconnection lines and said semiconductor substrate and said isolation regions;

partially etching back said first silicon nitride layer to leave first spacers on the sidewalls of said gate electrodes and interconnection lines and leaving said first silicon nitride layer overlying said gate electrodes, said interconnection lines, said semiconductor substrate, and said isolation regions;

depositing a first insulating layer overlying said substrate;

forming a photoresist mask over said first insulating layer;

first etching away said first insulating layer where it is not covered by said photoresist mask wherein said first etching has a selectivity of said first insulating layer with respect to said first silicon nitride layer of about 20:1 whereby said isolation regions are protected by said first silicon nitride layer during said first etching and whereby pillars of said first insulating layer are formed overlying each of said gate electrodes and said interconnection lines;

thereafter second etching away said first silicon nitride layer not covered by said photoresist mask wherein said second etching has a selectivity of said first silicon nitride layer with respect to said first insulating layer of about 40:1 whereby said source and drain regions within said semiconductor substrate are exposed;

depositing a layer of polysilicon over said substrate and contacting said exposed source and drain regions;

depositing a silicide layer overlying said polysilicon layer;

depositing a second silicon nitride layer overlying said silicide layer;

etching away said second silicon nitride layer, said silicide layer, and said polysilicon layer where they are not covered by a mask with an etch stop at said pillars to form a bit line whereby said polysilicon layer remaining between said pillars and contacting said source and drain regions forms polysilicon landing plugs and wherein said polysilicon landing plug underlying said bit line forms a bit line contact and wherein corners of said pillars are exposed;

etching away said exposed corners of said pillars;

forming second spacers comprising silicon nitride on the sidewall of said bit line wherein said second spacers overlie said pillars where said exposed corners have been etched away;

depositing a second insulating layer overlying said substrate;

etching away said second insulating layer where it is not covered by a mask to form contact openings to said polysilicon landing plugs on either side of said bit line;

depositing a first conducting layer conformally over the surface of said second insulating layer and within said contact openings wherein said first conducting layer forms a lower electrode of said capacitor;

depositing a third insulating layer overlying said first conducting layer and polishing away said third insulating layer until said first conducting layer on the top surface of said second insulating layer is removed thereby exposing said second insulating layer;

removing said third insulating layer and said exposed second insulating layer;

depositing a capacitor dielectric layer overlying said first conducting layer wherein said capacitor dielectric layer comprises one of the group containing tantalum oxide, barium strontium titanate, phosphorus zirconium titanate, and silicon oxide-silicon nitride-silicon oxide (ONO);

depositing a second conducting layer overlying said capacitor dielectric layer wherein said second conducting layer forms the upper electrode of said capacitor to complete formation of said DRAM with capacitor.

21. The method according to claim 20 wherein said isolation regions comprise field oxide.

22. The method according to claim 20 wherein said isolation regions comprise shallow trench isolation.

23. The method according to claim 20 wherein said first silicon nitride layer has a deposited thickness of between about 400 and 1000 Angstroms.

24. The method according to claim 20 wherein after said step of partially etching back said first silicon nitride layer, said first silicon nitride layer has a thickness of between about 50 and 150 Angstroms.

25. The method according to claim 20 wherein said first insulating layer comprises tetraethoxysilane (TEOS) oxide.

26. The method according to claim 20 wherein said first insulating layer comprises borophosphosilicate glass (BPSG).

27. The method according to claim 20 wherein said first insulating layer is planarized by chemical mechanical polishing.

28. The method according to claim 20 wherein said first insulating layer is planarized by etching back.

29. The method according to claim 20 wherein said first etching comprises flowing $C_4F_8$, $CH_2F_2$, CO, $O_2$, and Ar gases at a radio frequency power of 1000 to 1800 watts under a pressure of 30 to 50 mTorr.

30. The method according to claim 20 wherein said second etching comprises flowing $C_4F_8$, $CH_2F_2$, CO, $O_2$, and Ar gases at a radio frequency power of 200 to 800 watts under a pressure of 30 to 200 mTorr.

31. The method according to claim 20 wherein said second spacers comprise silicon oxynitride.

32. The method according to claim 20 wherein said second insulating layer comprises BPSG having a thickness of between about 7000 and 10,000 Angstroms and wherein said BPSG is reflowed to planarize its surface.

33. The method according to claim 20 wherein said second insulating layer comprises spin-on-glass having a thickness of between about 7000 and 10,000 Angstroms and wherein said spin-on-glass is partially etched back to planarize its surface.

34. The method according to claim 20 wherein said first conducting layer comprises one of the group containing polysilicon, tungsten, and titanium nitride.

35. The method according to claim 20 wherein said third insulating layer comprises silicon oxide having a thickness of between about 5000 and 10,000 Angstroms.

36. The method according to claim 20 wherein said capacitor dielectric layer has a thickness of between about 30 and 200 Angstroms.

37. The method according to claim 20 wherein said second conducting layer comprises one of the group containing polysilicon, titanium nitride, and tungsten and has a thickness of between about 500 and 1500 Angstroms.

38. A dynamic random access memory (DRAM) having a capacitor comprising:

an active area of a semiconductor substrate separated from other active areas by isolation regions;

gate electrodes and interconnection lines on said semiconductor substrate and said isolation regions and associated source and drain regions within said semiconductor substrate;

silicon nitride spacers on the sidewalls of said gate electrodes and interconnection lines;

polysilicon landing plugs contacting said source and drain regions;

a bit line overlying one of said polysilicon landing plugs wherein said bit line comprises:
  said one of said polysilicon landing plugs;
  a silicide layer overlying said polysilicon landing plug;
  a silicon nitride layer overlying said silicide layer; and
  silicon nitride spacers on the sidewalls of said bit line; and a capacitor having a crown shape comprising:
  a first conducting layer contacting said polysilicon landing plugs on either side of said bit line wherein said polysilicon landing plugs form a capacitor node and wherein said first conducting layer forms a lower electrode of said capacitor;
  a capacitor dielectric layer overlying said first conducting layer; and
  a second conducting layer overlying said capacitor dielectric layer wherein said second conducting layer forms the upper electrode of said capacitor to complete said DRAM with capacitor.

39. The device according to claim 38 wherein said first conducting layer comprises one of the group containing polysilicon, tungsten, and titanium nitride.

40. The device according to claim 38 wherein said capacitor dielectric layer comprises one of the group containing tantalum oxide, barium strontium titanate, phosphorus zirconium titanate, and silicon oxide-silicon nitride-silicon oxide (ONO) and wherein said capacitor dielectric layer has a thickness of between about 50 and 150 Angstroms.

41. The device according to claim 38 wherein said second conducting layer comprises one of the group containing polysilicon, titanium nitride, and tungsten and has a thickness of between about 500 and 1500 Angstroms.

* * * * *